(12) United States Patent
Kaneda (10) Patent No.: US 11,769,632 B2
(45) Date of Patent: *Sep. 26, 2023

(54) CERAMIC CAPACITOR HAVING BARIUM TITANATE-BASED DIELECTRIC LAYERS INCLUDING SIX SUB-COMPONENTS

(71) Applicant: TAIYO YUDEN CO., LTD., Tokyo (JP)

(72) Inventor: Kazumi Kaneda, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 359 days.

This patent is subject to a terminal disclaimer.

(21) Appl. No.: 17/103,789

(22) Filed: Nov. 24, 2020

(65) Prior Publication Data

US 2021/0104365 A1    Apr. 8, 2021

Related U.S. Application Data

(63) Continuation of application No. 16/250,903, filed on Jan. 17, 2019, now Pat. No. 10,879,008.

(30) Foreign Application Priority Data

Jan. 26, 2018    (JP) ................. 2018-011552

(51) Int. Cl.
  *C04B 35/468*    (2006.01)
  *H01G 4/30*    (2006.01)
  (Continued)

(52) U.S. Cl.
  CPC .............. *H01G 4/30* (2013.01); *H01G 2/065* (2013.01); *H01G 4/008* (2013.01);
  (Continued)

(58) Field of Classification Search
  CPC .............. C04B 35/468; C04B 35/4682; C04B 2235/3262; C04B 2235/3224; C04B 2235/3239
  See application file for complete search history.

(56) References Cited

U.S. PATENT DOCUMENTS

| 7,678,724 B2 | 3/2010 | Yanagida et al. |
| 7,898,793 B2 | 3/2011 | Ito et al. |

(Continued)

FOREIGN PATENT DOCUMENTS

| JP | 2009084111 A | 4/2009 |
| JP | 2010199268 A | 9/2010 |
| WO | 2013145421 A1 | 10/2013 |

OTHER PUBLICATIONS

A Notice of Reasons for Refusal issued by the Japanese Patent Office, dated Oct. 12, 2021, for Japanese counterpart application No. 2018-011552. (3 pages).

(Continued)

*Primary Examiner* — Noah S Wiese
(74) *Attorney, Agent, or Firm* — Law Office of Katsuhiro Arai (57) ABSTRACT

A ceramic capacitor includes: a multilayer structure in which each of a plurality of dielectric layers and each of a plurality of internal electrode layers are alternately stacked, wherein a main component of the plurality of dielectric layers is $BaTiO_3$, wherein the plurality of dielectric layers include Mn as a first sub-component, Mg as a second sub-component, a rare earth element which is at least one of Ho and Dy as a third sub-component, V as a fourth sub-component, Si as a fifth sub-component, Ca as a sixth sub-component, wherein an average grain diameter of ceramic grains of the plurality of dielectric layers is 280 nm or more and 380 nm or less.

14 Claims, 5 Drawing Sheets

(51) Int. Cl.
H01G 4/12 (2006.01)
H01G 2/06 (2006.01)
H05K 1/18 (2006.01)
H01G 4/008 (2006.01)

(52) U.S. Cl.
CPC .......... *H01G 4/1227* (2013.01); *H05K 1/181* (2013.01); *H05K 2201/10015* (2013.01)

(56) References Cited

U.S. PATENT DOCUMENTS

| | | |
|---|---|---|
| 8,367,206 B2 | 2/2013 | Park et al. |
| 2014/0057087 A1 | 2/2014 | Adachi et al. |
| 2015/0036264 A1 | 2/2015 | Morita et al. |

OTHER PUBLICATIONS

Non-Final Office Action issued by U.S. Patent and Trademark Office, dated Mar. 19, 2020, for related U.S. Appl. No. 16/250,903 (11 pages).

Notice of Allowance issued by U.S Patent and Trademark Office, dated Aug. 26, 2020, for related U.S. Appl. No. 16/250,903 (8 pages).

| | atm% WITH RESPECT TO Ti | | | | | | | |
|---|---|---|---|---|---|---|---|---|
| | Mn | Mg | Ho | Dy | V | Si | Ca | Ba/Ti |
| COMPARATIVE EXAMPLE 1 | 0.00 | 0.60 | 0.68 | | 0.25 | 0.50 | 0.15 | 0.9996 |
| EXAMPLE 1 | 0.05 | 0.60 | 0.68 | | 0.25 | 0.50 | 0.15 | 0.9997 |
| EXAMPLE 2 | 0.15 | 0.60 | 0.68 | | 0.25 | 0.50 | 0.15 | 0.9997 |
| EXAMPLE 3 | 0.35 | 0.60 | 0.68 | | 0.25 | 0.50 | 0.15 | 0.9997 |
| COMPARATIVE EXAMPLE 2 | 0.45 | 0.60 | 0.68 | | 0.25 | 0.50 | 0.15 | 0.9996 |
| COMPARATIVE EXAMPLE 3 | 0.15 | 0.20 | 0.68 | | 0.25 | 0.50 | 0.15 | 0.9995 |
| EXAMPLE 4 | 0.15 | 0.40 | 0.68 | | 0.25 | 0.50 | 0.15 | 0.9996 |
| EXAMPLE 5 | 0.15 | 0.60 | 0.68 | | 0.25 | 0.50 | 0.15 | 0.9997 |
| EXAMPLE 6 | 0.15 | 0.80 | 0.68 | | 0.25 | 0.50 | 0.15 | 0.9993 |
| COMPARATIVE EXAMPLE 4 | 0.15 | 1.00 | 0.68 | | 0.25 | 0.50 | 0.15 | 0.9998 |
| COMPARATIVE EXAMPLE 5 | 0.15 | 0.60 | 0.20 | | 0.25 | 0.50 | 0.15 | 0.9996 |
| EXAMPLE 7 | 0.15 | 0.60 | 0.50 | | 0.25 | 0.50 | 0.15 | 0.9999 |
| EXAMPLE 8 | 0.15 | 0.60 | 0.70 | | 0.25 | 0.50 | 0.15 | 0.9997 |
| EXAMPLE 9 | 0.15 | 0.60 | 0.90 | | 0.25 | 0.50 | 0.15 | 0.9998 |
| COMPARATIVE EXAMPLE 6 | 0.15 | 0.60 | 1.10 | | 0.25 | 0.50 | 0.15 | 0.9996 |
| COMPARATIVE EXAMPLE 7 | 0.15 | 0.60 | 0.68 | | 0.00 | 0.60 | 0.15 | 1.0002 |
| EXAMPLE 10 | 0.15 | 0.60 | 0.68 | | 0.15 | 0.60 | 0.15 | 1.0001 |
| EXAMPLE 11 | 0.15 | 0.60 | 0.68 | | 0.25 | 0.60 | 0.15 | 1.0002 |
| EXAMPLE 12 | 0.15 | 0.60 | 0.68 | | 0.30 | 0.60 | 0.15 | 1.0002 |
| COMPARATIVE EXAMPLE 8 | 0.15 | 0.60 | 0.68 | | 0.35 | 0.60 | 0.15 | 0.9998 |
| COMPARATVE EXAMPLE 9 | 0.15 | 0.60 | 0.68 | | 0.25 | 0.30 | 0.15 | 1.0000 |
| EXAMPLE 13 | 0.15 | 0.60 | 0.68 | | 0.25 | 0.40 | 0.15 | 0.9998 |
| EXAMPLE 14 | 0.15 | 0.60 | 0.68 | | 0.25 | 0.60 | 0.15 | 0.9995 |
| EXAMPLE 15 | 0.15 | 0.60 | 0.68 | | 0.25 | 0.90 | 0.15 | 1.0000 |
| COMPARATIVE EXAMPLE 10 | 0.15 | 0.60 | 0.68 | | 0.25 | 1.00 | 0.15 | 0.9996 |
| EXAMPLE 16 | 0.15 | 0.60 | 0.68 | | 0.25 | 0.50 | 0.00 | 1.0002 |
| EXAMPLE 17 | 0.15 | 0.60 | 0.68 | | 0.25 | 0.50 | 0.25 | 1.0002 |
| EXAMPLE 18 | 0.15 | 0.60 | 0.68 | | 0.25 | 0.50 | 0.45 | 1.0002 |
| COMPARATIVE EXAMPLE 11 | 0.15 | 0.60 | 0.68 | | 0.25 | 0.50 | 0.55 | 1.0002 |
| COMPARATIVE EXAMPLE 12 | 0.15 | 0.60 | 0.68 | | 0.25 | 0.50 | 0.15 | 0.9985 |
| EXMAPLE 19 | 0.15 | 0.60 | 0.68 | | 0.25 | 0.50 | 0.15 | 0.9990 |
| EXMAPLE 20 | 0.15 | 0.60 | 0.68 | | 0.25 | 0.50 | 0.15 | 1.0002 |
| EXMAPLE 21 | 0.15 | 0.60 | 0.68 | | 0.25 | 0.50 | 0.15 | 1.0015 |
| COMPARATIVE EXAMPLE 13 | 0.15 | 0.60 | 0.68 | | 0.25 | 0.50 | 0.15 | 1.0020 |
| COMPARATIVE EXAMPLE 14 | 0.12 | 0.80 | 1.30 | | 0.18 | 0.90 | 0.20 | 1.0002 |
| EXAMPLE 22 | 0.15 | 0.60 | | 0.68 | 0.25 | 0.50 | 0.15 | 0.9997 |

FIG. 5

| | GRAIN DIAMETER nm | εr | tan δ (%) | TEMPERATURE CHARACTERISTIC | | X7R | MTTF hr |
|---|---|---|---|---|---|---|---|
| | | | | MAX TEMP. (°C) | MAX/125°C RATIO | | |
| COMPARATIVE EXAMPLE 1 | 329 | 3858 | 3.57 | 70 | 0.93 | ○ | 1 |
| EXAMPLE 1 | 330 | 3159 | 2.72 | 70 | 0.95 | ○ | 38 |
| EXAMPLE 2 | 327 | 3224 | 2.54 | 70 | 0.95 | ○ | 39 |
| EXAMPLE 3 | 335 | 3169 | 2.46 | 70 | 0.95 | ○ | 50 |
| COMPARATIVE EXAMPLE 2 | 331 | 3200 | 2.71 | 120 | 0.97 | ○ | 12 |
| COMPARATIVE EXAMPLE 3 | 1000≤ | 4464 | 16.8 | 100 | 0.70 | × | 12 |
| EXAMPLE 4 | 345 | 3666 | 4.5 | 85 | 0.94 | ○ | 46 |
| EXAMPLE 5 | 327 | 3050 | 2.6 | 70 | 0.94 | ○ | 43 |
| EXAMPLE 6 | 337 | 3474 | 2.7 | 50 | 0.92 | ○ | 54 |
| COMPARATIVE EXAMPLE 4 | 335 | 4041 | 3.0 | 40 | 0.90 | ○ | 14 |
| COMPARATIVE EXAMPLE 5 | 343 | 3560 | 3.85 | 120 | 0.96 | ○ | 18 |
| EXAMPLE 7 | 331 | 3406 | 3.36 | 120 | 0.96 | ○ | 39 |
| EXAMPLE 8 | 320 | 3210 | 2.48 | 70 | 0.94 | ○ | 54 |
| EXAMPLE 9 | 323 | 3147 | 2.18 | 40 | 0.92 | ○ | 42 |
| COMPARATIVE EXAMPLE 6 | 317 | 3064 | 2.02 | 40 | 0.92 | ○ | 12 |
| COMPARATIVE EXAMPLE 7 | 307 | 3117 | 2.21 | 40 | 0.84 | × | 5 |
| EXAMPLE 10 | 313 | 2965 | 2.20 | 40 | 0.88 | ○ | 39 |
| EXAMPLE 11 | 311 | 2762 | 2.37 | 70 | 0.94 | ○ | 50 |
| EXAMPLE 12 | 315 | 2780 | 2.54 | 80 | 0.94 | ○ | 53 |
| COMPARATIVE EXAMPLE 8 | 319 | 2809 | 2.86 | 90 | 0.95 | × | 62 |
| COMPARATVE EXAMPLE 9 | NOT FORMED | | | | | | |
| EXAMPLE 13 | 308 | 3242 | 2.28 | 50 | 0.95 | ○ | 43 |
| EXAMPLE 14 | 343 | 3073 | 2.63 | 85 | 0.97 | ○ | 76 |
| EXAMPLE 15 | 330 | 3297 | 2.93 | 85 | 0.97 | ○ | 87 |
| COMPARATIVE EXAMPLE 10 | 403 | 3902 | 5.50 | 85 | 0.96 | × | 53 |
| EXAMPLE 16 | 320 | 2991 | 2.33 | 40 | 0.90 | ○ | 60 |
| EXAMPLE 17 | 306 | 3047 | 2.30 | 40 | 0.88 | ○ | 41 |
| EXAMPLE 18 | 314 | 3064 | 2.15 | 40 | 0.87 | ○ | 47 |
| COMPARATIVE EXAMPLE 11 | 310 | 2850 | 2.07 | 30 | 0.85 | × | 40 |
| COMPARATIVE EXAMPLE 12 | 385 | 3550 | 3.70 | 85 | 0.93 | × | 68 |
| EXMAPLE 19 | 340 | 2965 | 2.47 | 70 | 0.96 | ○ | 75 |
| EXMAPLE 20 | 311 | 2917 | 2.25 | 70 | 0.96 | ○ | 69 |
| EXMAPLE 21 | 307 | 2926 | 2.05 | 50 | 0.94 | ○ | 83 |
| COMPARATIVE EXAMPLE 13 | 302 | 2805 | 2.02 | 30 | 0.92 | × | 74 |
| COMPARATIVE EXAMPLE 14 | 198 | 1723 | 1.07 | ≤30 | ~ | × | ~ |
| EXAMPLE 22 | 330 | 3400 | 2.60 | 60 | 0.95 | ○ | 74 |

CERAMIC CAPACITOR HAVING BARIUM TITANATE-BASED DIELECTRIC LAYERS INCLUDING SIX SUB-COMPONENTS

CROSS-REFERENCE TO RELATED APPLICATION

This application is a continuation of U.S. patent application Ser. No. 16/250,903, filed Jan. 17, 2019, which claims priority to Japanese Patent Application No. 2018-011552, filed Jan. 26, 2018, the disclosure of which is herein incorporated by reference in its entirety. The applicant herein explicitly rescinds and retracts any prior disclaimers or disavowals or any amendment/statement otherwise limiting claim scope made in any parent, child or related prosecution history with regard to any subject matter supported by the present application.

FIELD

A certain aspect of the present invention relates to a ceramic capacitor, a circuit substrate and a manufacturing method of the ceramic capacitor.

BACKGROUND

Ceramic capacitors are widely used under a high temperature condition such as in cars. And so, the ceramic capacitors are required to have capacity stability at a high temperature, high reliability under high temperature load, and so on. Recently, it is one of important properties that the ceramic capacitors satisfy X7R characteristic of EIA standard. A capacity changing rate is within ±15% in a temperature ranges from −55 degrees C. to +125 degrees C. with respect to 25 degrees C., in the EIA standard. And so, there is disclosed a dielectric material, in which a composition or a micro structure is adjusted or designed, satisfies the X7R characteristic (for example, see Japanese Patent Application Publication No. 2010-199268).

SUMMARY OF THE INVENTION

However, it is difficult to achieve both the capacity stability and the high reliability, even if the technology of Japanese Patent Application Publication No. 2010-199268 is used.

The present invention has a purpose of providing a ceramic capacitor and a circuit substrate that are capable of achieving both capacity stability and high reliability and a manufacturing method of the ceramic capacitor.

According to an aspect of the present invention, there is provided a ceramic capacitor including: a multilayer structure in which each of a plurality of dielectric layers and each of a plurality of internal electrode layers are alternately stacked, wherein a main component of the plurality of dielectric layers is ceramic having a perovskite structure expressed by $Ba_mTiO_3$ ($0.9990 \leq m \leq 1.0015$), wherein the plurality of dielectric layers include 0.05 atm % or more and 0.35 atm % or less of Mn as a first sub-component, 0.4 atm % or more and 0.8 atm % or less of Mg as a second sub-component, 0.5 atm % or more and 0.9 atm % or less of a rare earth element which is at least one of Ho and Dy as a third sub-component, 0.15 atm % or more and 0.30 atm % or less of V as a fourth sub-component, 0.4 atm % or more and 0.9 atm % or less of Si as a fifth sub-component, 0.00 atm % or more and 0.45 atm % or less of Ca as a sixth sub-component, on a presumption that an amount of Ti of the perovskite structure is 100 atm %, wherein an average grain diameter of ceramic grains of the plurality of dielectric layers is 280 nm or more and 380 nm or less.

According to an aspect of the present invention, there is provided a manufacturing method of a ceramic capacitor including: forming a green sheet by adding Mn as a first sub-component by 0.05 atm % or more and 0.35 atm % or less, adding Mg as a second sub-component by 0.4 atm % or more and 0.8 atm % or less, adding a rare earth element which is at least one of Ho and Dy as a third sub-component by 0.5 atm % or more and 0.9 atm % or less, adding V as a fourth sub-component by 0.15 atm % or more and 0.30 atm % or less, adding Si as a fifth sub-component by 0.4 atm % or more and 0.9 atm % or less, adding Ca as a sixth sub-component by 0.00 atm % or more and 0.45 atm % or less, to ceramic powder having a perovskite structure expressed by $Ba_mTiO_3$ ($0.9990 \leq m \leq 1.0015$), on a presumption that an amount of Ti of the perovskite structure is 100 atm %; arranging a metal conductive paste for forming an internal electrode, on the green sheet; and firing the green sheet on which the metal conductive paste was arranged, wherein a condition of the firing is adjusted so that an average grain diameter of the $Ba_mTiO_3$ is 280 nm or more and 380 nm or less in dielectric layers formed in the firing.

DETAILED DESCRIPTION

A description will be given of an embodiment with reference to the accompanying drawings.

Embodiment

Figure 1:
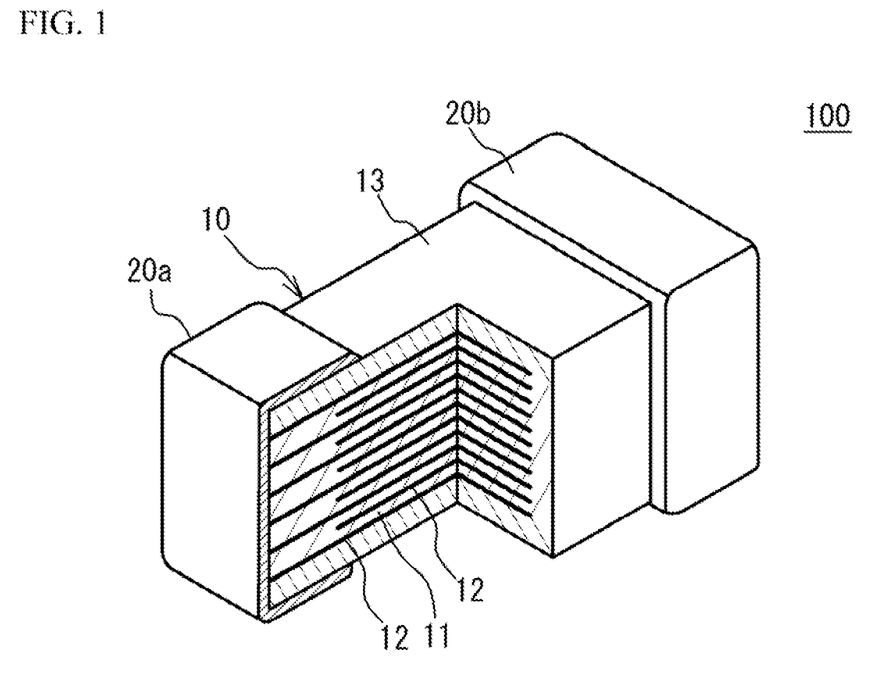
FIG. 1 illustrates a partial perspective view of a multilayer ceramic capacitor.

FIG. 1 illustrates a partial perspective view of a multilayer ceramic capacitor 100 in accordance with an embodiment. As illustrated in FIG. 1, the multilayer ceramic capacitor 100 includes a ceramic main body 10 having a rectangular parallelepiped shape, and a pair of external electrodes 20a and 20b that are respectively provided at two edge faces of the ceramic main body 10 facing each other. In four faces other than the two edge faces of the ceramic main body 10, two faces other than an upper face and a lower face of the ceramic main body 10 in a stacking direction are referred to as side faces. The external electrodes 20a and 20b extend to the upper face, the lower face and the two side faces of the ceramic main body 10. However, the external electrodes 20a and 20b are spaced from each other.

The ceramic main body 10 has a structure designed to have dielectric layers 11 and internal electrode layers 12 alternately stacked. The dielectric layer 11 includes ceramic material acting as a dielectric material. The internal electrode layers 12 include a base metal material. End edges of the internal electrode layers 12 are alternately exposed to a first edge face of the ceramic main body 10 and a second edge face of the ceramic main body 10 that is different from the first edge face. In the embodiment, the first face faces with the second face. The external electrode 20a is provided on the first edge face. The external electrode 20b is provided on the second edge face. Thus, the internal electrode layers 12 are alternately conducted to the external electrode 20a and the external electrode 20b. Thus, the multilayer ceramic capacitor 100 has a structure in which a plurality of dielectric layers 11 are stacked and each two of the dielectric layers 11 sandwich the internal electrode layer 12. In the ceramic main body 10, the internal electrode layer 12 is positioned at an outermost layer. The upper face and the lower face of the ceramic main body 10 that are the internal electrode layers 12 are covered by cover layers 13. A main component of the cover layer 13 is a ceramic material. For example, a main component of the cover layer 13 is the same as that of the dielectric layer 11.

For example, the multilayer ceramic capacitor 100 may have a length of 0.25 mm, a width of 0.125 mm and a height of 0.125 mm. The multilayer ceramic capacitor 100 may have a length of 0.4 mm, a width of 0.2 mm and a height of 0.2 mm. The multilayer ceramic capacitor 100 may have a length of 0.6 mm, a width of 0.3 mm and a height of 0.3 mm. The multilayer ceramic capacitor 100 may have a length of 1.0 mm, a width of 0.5 mm and a height of 0.5 mm. The multilayer ceramic capacitor 100 may have a length of 3.2 mm, a width of 1.6 mm and a height of 1.6 mm. The multilayer ceramic capacitor 100 may have a length of 4.5 mm, a width of 3.2 mm and a height of 2.5 mm. However, the size of the multilayer ceramic capacitor 100 is not limited.

A main component of the internal electrode layers 12 is a base metal such as nickel (Ni), copper (Cu), tin (Sn) or the like. The internal electrode layers 12 may be made of a noble metal such as platinum (Pt), palladium (Pd), silver (Ag), gold (Au) or alloy thereof. The dielectric layers 11 are mainly composed of a ceramic material that is expressed by a general formula $ABO_3$ and has a perovskite structure. The perovskite structure includes $ABO_{3-\alpha}$ having an off-stoichiometric composition. The perovskite structure is barium titanate including Ba (barium) and Ti (titanium) and is expressed by a formula $Ba_mTiO_3$. Barium titanate is a ferroelectric material and achieves a high dielectric constant.

In the multilayer ceramic capacitor 100, the dielectric layers 11 include sub-components. Thus, the multilayer ceramic capacitor 100 achieves both capacity stability and high reliability. A description will be given of details of the sub-components added to the dielectric layers 11.

The dielectric layers 11 include Mn (manganese) as a first sub-component. Mn achieves preferable sintering characteristic and has a function of improving life property of the multilayer ceramic capacitor 100. It is therefore possible to achieve the high reliability of the multilayer ceramic capacitor 100. However, when an amount of Mn is excessively small, the high reliability may not be necessarily achieved. On the other hand, when the amount of Mn is excessively large, insulation characteristic may be degraded and the reliability may be degraded because of reduction of boundary resistance of ceramic grains. And so, a Mn concentration in the dielectric layers 11 has an upper limit and a lower limit. In concrete, the dielectric layers 11 include 0.05 atm % or more and 0.35 atm % or less of Mn, on a presumption that an amount of Ti of $Ba_mTiO_3$ acting as a main component of the dielectric layers 11 is 100 atm %. It is preferable that the dielectric layers 11 include 0.10 atm % or more and 0.30 atm % or less of Mn, on a presumption that the amount of Ti of $Ba_mTiO_3$ acting as the main component of the dielectric layers 11 is 100 atm %.

Next, the dielectric layers 11 include Mg (magnesium) as a second sub-component. Mg has a function of controlling grain growth during firing and achieves the capacity stability and the high reliability. However, when an amount of Mg is excessively small, sufficient capacity stability may not be necessarily achieved. And, grain growth may occur during sintering, and the reliability may be degraded. On the other hand, when the amount of Mg is excessively large, the reliability may be degraded because of excessive amount of acceptors. And so, a Mg concentration of the dielectric layers 11 has an upper limit and a lower limit. In concrete, the dielectric layers 11 include 0.4 atm % or more and 0.8 atm % or less of Mg, on a presumption that an amount of Ti of $Ba_mTiO_3$ acting as a main component of the dielectric layers 11 is 100 atm %. It is preferable that the dielectric layers 11 include 0.5 atm % or more and 0.7 atm % or less of Mg, on a presumption that the amount of Ti of $Ba_mTiO_3$ acting as the main component of the dielectric layers 11 is 100 atm %.

The dielectric layers 11 include a rare earth element Re which is at least one of Ho (holmium) and Dy (dysprosium), as a third sub-component. The rare earth element Re has a function of adjusting balance between sites in which an additive element is solid-solved (A site and B site) and achieves the high reliability. However, when an amount of the rare earth element Re is excessively small, sufficient reliability may not be necessarily achieved. On the other hand, when the amount of Re is excessively large, sintering characteristic of the dielectric layers 11 may be degraded and sufficient reliability may not be necessarily achieved because of increasing of sintering temperature of ceramic. And so, a concentration of the rare earth element Re of the dielectric layers 11 has an upper limit and a lower limit. In the following, the concentration of the rare earth element Re is a total concentration of Ho and Dy. In concrete, the dielectric layers 11 include 0.5 atm % or more and 0.9 atm % or less of the rare earth element Re, on a presumption that an amount of Ti of $Ba_mTiO_3$ acting as a main component of the dielectric layers 11 is 100 atm %. It is preferable that the dielectric layers 11 include 0.6 atm % or more and 0.8 atm % or less of the rare earth element Re, on a presumption that the amount of Ti of $Ba_mTiO_3$ acting as the main component of the dielectric layers 11 is 100 atm %.

The dielectric layers 11 include V (vanadium) as a fourth sub-component. V has a function of suppressing oxygen defect occurrence, controlling of a micro structure of ceramic, and so on. And, V achieves the high reliability and the capacity stability. However, when an amount of V is excessively small, sufficient high reliability and sufficient capacity stability may not be necessarily achieved. On the other hand, when the amount of V is excessively large, sufficient capacity stability may not be necessarily achieved because of reduction of electric resistance or not achieving of desirable micro structure of ceramic. And so, a V concentration of the dielectric layers 11 has an upper limit and a lower limit. In concrete, the dielectric layers 11 include 0.15 atm % or more and 0.30 atm % or less of V, on a presumption that an amount of Ti of $Ba_mTiO_3$ acting as a main component of the dielectric layers 11 is 100 atm %. It is preferable that the dielectric layers 11 include 0.18 atm % or more and 0.27 atm % or less of V, on a presumption that the amount of Ti of $Ba_mTiO_3$ acting as the main component of the dielectric layers 11 is 100 atm %.

The dielectric layers 11 include Si (silicon) as a fifth sub-component. Si achieves preferable sintering because Si acts as a sintering assistant. However, when an amount of Si is excessively small, sintering at an adequate temperature (for example, 1260 degrees C. or less) may be difficult and the dielectric layers 11 may not be necessarily formed. On the other hand, when the amount of Si is excessively large, grain growth may occur during the firing and sufficient capacity stability may not be necessarily achieved because of excessive occurrence of a liquid phase component. And so, a Si concentration of the dielectric layers 11 has an upper limit and a lower limit. In concrete, the dielectric layers 11 include 0.4 atm % or more and 0.9 atm % or less of Si, on a presumption that an amount of Ti of $Ba_mTiO_3$ acting as a main component of the dielectric layers 11 is 100 atm %. It is preferable that the dielectric layers 11 include 0.5 atm % or more and 0.8 atm % or less of Si, on a presumption that the amount of Ti of $Ba_mTiO_3$ acting as the main component of the dielectric layers 11 is 100 atm %.

The dielectric layers 11 include Ca (calcium) as a sixth sub-component. Ca acts as a sintering assistant. It is possible to use Ca for adjusting an AB ratio which is a molar ratio of A site element and B site element. However, when an amount of Ca is excessively large, sufficient capacity stability may not be necessarily achieved because of excessive amount of the A site component. And so, a Ca concentration of the dielectric layers 11 has an upper limit. In concrete, the dielectric layers 11 include 0.00 atm % or more and 0.45 atm % or less of Ca, on a presumption that an amount of Ti of $Ba_mTiO_3$ acting as a main component of the dielectric layers 11 is 100 atm %. "0.00 atm % or more" means that there may be a case where the dielectric layers 11 does not include Ca. It is preferable that the dielectric layers 11 include 0.10 atm % or more and 0.40 atm % or less of Ca, on a presumption that the amount of Ti of $Ba_mTiO_3$ acting as the main component of the dielectric layers 11 is 100 atm %.

When "m" of $Ba_mTiO_3$ acting as the main component of the dielectric layers 11 is excessively small, the life property of the multilayer ceramic capacitor 100 may be degraded and high reliability may not be necessarily achieved. And so, "m" satisfies $0.9990 \leq m$. On the other hand, "m" is excessively large, the capacity stability may not be necessarily achieved. And so, "m" satisfies $m \leq 1.0015$.

Next, when an average grain diameter of $Ba_mTiO_3$ acting as the main component ceramic of the dielectric layers 11 is excessively small, the capacity stability may be degraded because of not obtaining the micro structure of ceramic. On the other hand, when the average grain diameter is excessively large, the insulation resistance may be degraded and the reliability may be degraded because of reduction of the number of grains boundaries. And so, the average grain diameter of $Ba_mTiO_3$ has an upper limit and a lower limit. In concrete, the average grain diameter of $Ba_mTiO_3$ is 280 nm or more and 380 nm or less. It is preferable that the average grain diameter of $Ba_mTiO_3$ is 300 nm or more and 360 nm or less.

It is possible to calculate the average grain diameter by an arithmetical mean. For example, SEM observation is performed with a field in which 100 to 200 numbers of crystal grains can be observed. For example, a magnification factor is 40 thousand times or the like. In the obtained SEM image, grains which are visually observed are arranged in a single direction. And a diameter of the grains is measured. For example, the direction of the grains in the SEM image is unified in a lateral direction. A total of measured diameters is divided by the number of the measured grains, and an average value is calculated. The direction of the image and the direction of the measurement may be optional.

As mentioned above, the amounts of the first sub-component to the sixth sub-component are regulated in the dielectric layers 11. "m" in $Ba_mTiO_3$ is regulated. And the average grain diameter of $Ba_mTiO_3$ is regulated. Thus, both the capacity stability and the high reliability can be achieved. The main component of the material of the cover layer 13 is the same as the main component of the ceramic material of the dielectric layers 11. However, it is preferable that the amounts of the first sub-component to the sixth sub-component are regulated in the cover layer 13, "m" in $Ba_mTiO_3$ is regulated, and the average grain diameter of $Ba_mTiO_3$ is regulated, as well as the dielectric layers 11.

Figure 2:
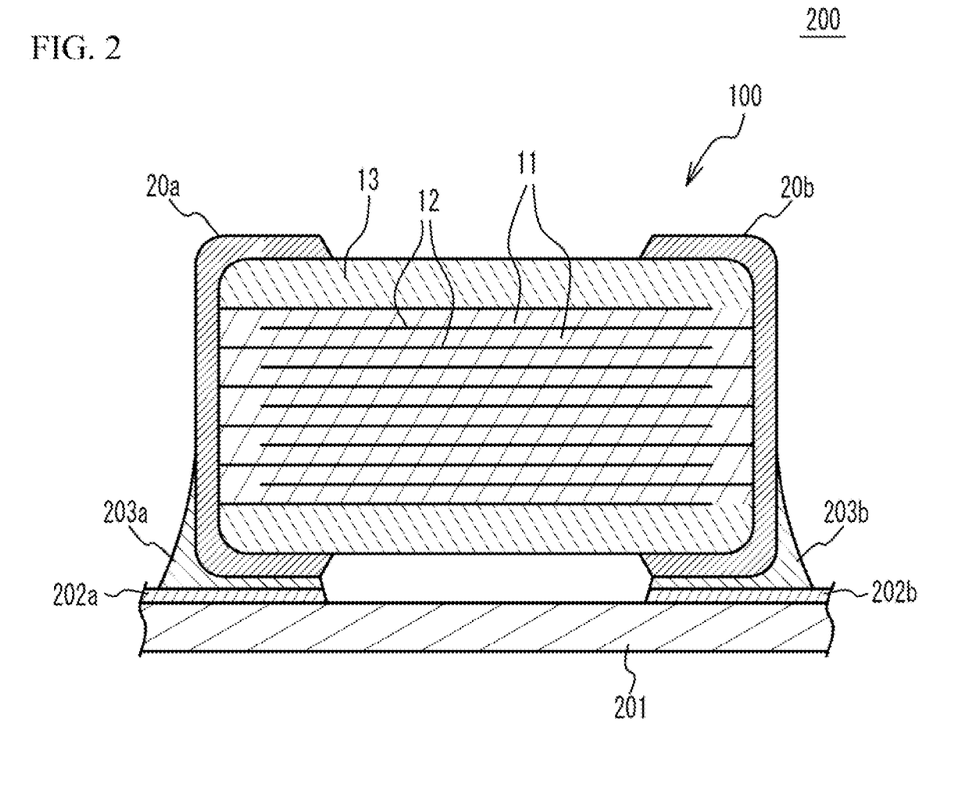
FIG. 2 illustrates a circuit substrate.

FIG. 2 illustrates a circuit substrate 200. As illustrated in FIG. 2, the circuit substrate 200 has a structure in which the multilayer ceramic capacitor 100 is mounted on a substrate 201. A wiring pattern 202a, a wiring pattern 202b and so on are provided on a mounting face of the substrate 201. The external electrode 20a is connected to the wiring pattern 202a via a solder 203a and is electrically coupled with the wiring pattern 202a. The external electrode 20b is connected to the wiring pattern 202b via a solder 203b and is electrically coupled with the wiring pattern 202b. In this manner, the multilayer ceramic capacitor 100 may be mounted on the substrate 201.

Figure 3:
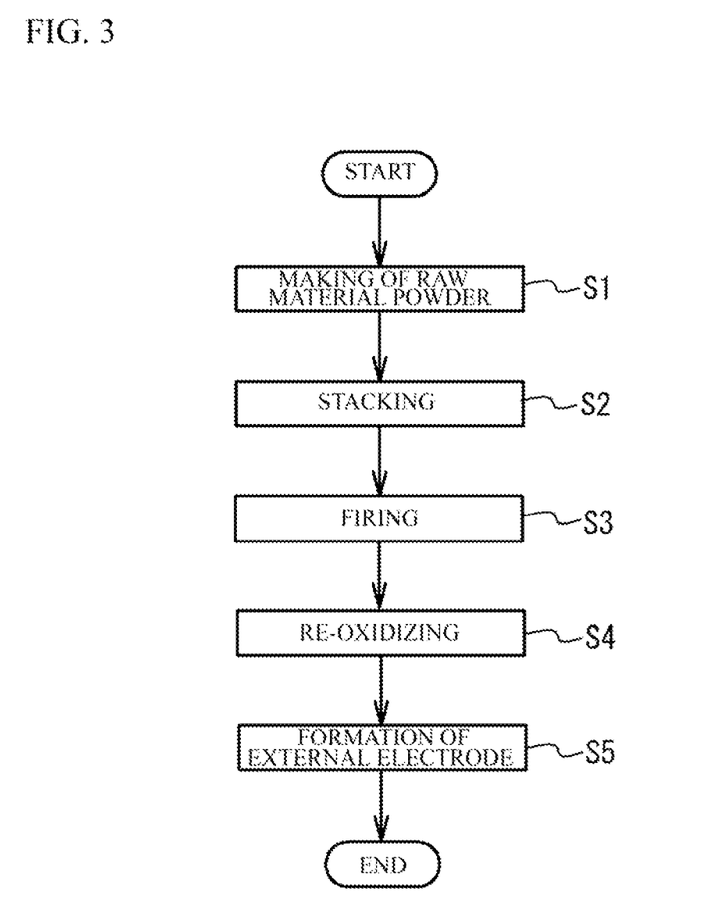
FIG. 3 illustrates a manufacturing method of a multilayer ceramic capacitor.

Next, a description will be given of a manufacturing method of the multilayer ceramic capacitor 100. FIG. 3 illustrates a manufacturing method of the multilayer ceramic capacitor 100.

(Making process of a raw material powder) A dielectric material for forming the dielectric layer 11 is prepared. Generally, an A site element and a B site element are included in the dielectric layer 11 in a sintered phase of grains of $ABO_3$. For example, barium titanate is tetragonal compound having a perovskite structure and has a high dielectric constant.

Generally, $BaTiO_3$ is obtained by reacting a titanium material such as titanium dioxide with a barium material such as barium carbonate and synthesizing barium titanate. The titanium material and the barium material are reacted so that "m" satisfies $0.9990 \leq m \leq 1.0015$ in the general formula $A_mBO_3$ expressing the perovskite structure of the barium titanate. Various methods can be used as a synthesizing method of the ceramic structuring the dielectric layer 11. For example, a solid-phase method, a sol-gel method, a hydrothermal method or the like can be used. The embodiment may use any of these methods.

Additive compound may be added to the resulting ceramic powders, in accordance with purposes. The additive compound may be an oxide of Mg, Mn, V, Cr (chromium) or a rare earth element (Y (yttrium), Sm (samarium), Eu (europium), Gd (gadolinium), Tb (terbium), Dy (dysprosium), Ho, Er (erbium), Tm (thulium) and Yb (ytterbium)), or an oxide of Co (cobalt), Ni, Li (lithium), B (boron), Na (sodium), K (potassium) and Si, or glass.

In the embodiment, Mn is added as the first sub-component by 0.05 atm % or more and 0.35 atm % or less, Mg is added as the second sub-component by 0.4 atm % or more and 0.8 atm % or less, the rare earth element Re which is at least one of Ho and Dy is added as the third sub-component by 0.5 atm % or more and 0.9 atm % or less, V is added as the fourth sub-component by 0.15 atm % or more and 0.30 atm % or less, Si is added as the fifth sub-component by 0.4 atm % or more and 0.9 atm % or less, and Ca is added as the sixth sub-component by 0.00 atm % or more and 0.45 atm % or less, on a presumption that an amount of Ti of $Ba_mTiO_3$ acting as the main component of the ceramic material is 100 atm %.

In the embodiment, it is preferable that barium titanate particles are mixed with compound including additives and are calcined in a temperature range from 820 degrees C. to 1150 degrees C. Next, the resulting ceramic particles are wet-blended with additives, are dried and crushed. Thus, ceramic powder is prepared. For example, it is preferable that an average grain diameter of the resulting ceramic powder is 200 nm to 300 nm from a viewpoint of thickness reduction of the dielectric layer 11. The grain diameter may be adjusted by crushing the resulting ceramic powder as needed. Alternatively, the grain diameter of the resulting ceramic power may be adjusted by combining the crushing and classifying.

(Stacking process) Next, a binder such as polyvinyl butyral (PVB) resin, an organic solvent such as ethanol or toluene, and a plasticizer are added to the resulting dielectric material and wet-blended. With use of the resulting slurry, a green sheet with a thickness of 3 μm to 10 μm is molded by, for example, a die coater method or a doctor blade method, and then dried.

Then, a pattern of the internal electrode layer 12 is provided on the surface of the dielectric green sheet by printing metal conductive pastes for forming an internal electrode with use of screen printing or gravure printing. The conductive pastes include an organic binder. A plurality of patterns are alternatively exposed to the pair of external electrodes. As co-materials, ceramic particles are added to the conductive pastes. A main component of the ceramic particles is not limited. However, it is preferable that the main component of the ceramic particles is the same as that of the dielectric layer 11. For example, $BaTiO_3$ of which an average particle sire is 50 nm or less is evenly dispersed.

A cover sheet is formed by stacking a plurality of the green sheets. A plurality of the pattern-formed sheets are stacked on the cover sheet. And, another cover sheet is stacked on the plurality of the pattern-formed sheets by stacking a plurality of the green sheets. An obtained multi-layer structure is stamped into a predetermined size.

(Firing process) The binder is removed from the compact in $N_2$ atmosphere of a temperature range of 250 degrees C. to 500 degrees C. After that, the resulting compact is fired for ten minutes to 2 hours in a reductive atmosphere having an oxygen partial pressure of $10^{-9}$ to $10^{-12}$ atm in a temperature range of 1100 degrees C. to 1300 degrees C. Thus, each compound of the dielectric green sheet is sintered and grown into grains. In this manner, it is possible to form the ceramic main body 10. The firing condition may be adjusted so that an average grain diameter of $Ba_mTiO_3$ acting as the main component ceramic of the dielectric layers 11 after the firing is 280 nm or more and 380 nm or less.

(Re-oxidizing process) After that, a re-oxidizing process may be performed in $N_2$ gas atmosphere in a temperature range of 600 degrees C. to 1000 degrees C.

(Forming of external electrodes) After that, a conductive paste for forming the external electrodes 20a and 20b is coated on two edge faces of the obtained sintered structure to which the internal electrode layers are exposed. Cu or the like may be used as the conductive paste. The conductive paste is fired in $N_2$ atmosphere at a temperature (for example, 800 degrees C. to 900 degrees C.) lower than the firing temperature for forming the sintered structure. Thus, the external electrodes 20a and 20b are formed. After that, a metal such as Cu, Ni, Sn or the like may be coated by plating. The conductive paste for forming the external electrodes 20a and 20b may be coated on the two edge faces before the firing process, and the multilayer structure and the conductive paste may be fired in the firing process together with each other.

In the embodiment, Mn is added as the first sub-component by 0.05 atm % or more and 0.35 atm % or less, Mg is added as the second sub-component by 0.4 atm % or more and 0.8 atm % or less, the rare earth element Re which is at least one of Ho and Dy is added as the third sub-component by 0.5 atm % or more and 0.9 atm % or less, V is added as the fourth sub-component by 0.15 atm % or more and 0.30 atm % or less, Si is added as the fifth sub-component by 0.4 atm % or more and 0.9 atm % or less, and Ca is added as the sixth sub-component by 0.00 atm % or more and 0.45 atm % or less, to the ceramic powder having a perovskite structure expressed by $Ba_mTiO_3$ ($0.9990 \le m \le 1.0015$), on a presumption that an amount of Ti of $Ba_mTiO_3$ acting as the main component of the ceramic material is 100 atm %. The condition of the firing process is adjusted so that the average grain diameter of $Ba_mTiO_3$ is 280 nm or more and 380 nm or less in the dielectric layers 11 after the firing process. Thus, the multilayer ceramic capacitor 100 can achieve both the capacity stability and the high reliability.

The embodiment focuses on a multilayer ceramic capacitor. However, the embodiment may be applied to a ceramic capacitor having a single dielectric layer.

Examples

The multilayer ceramic capacitor was fabricated. And characteristic of the multilayer ceramic capacitor was measured.

$Ba_mTiO_3$ powder was prepared as the main component ceramic of the dielectric layers 11 and the cover layers 13. As the first sub-component, $MnCO_3$ was prepared. As the second sub-component, MgO was prepared. As the third sub-component, $Dy_2O_3$ and $Ho_2O_3$ were prepared. As the fourth sub-component, $V_2O_5$ was prepared. As the fifth sub-component, $SiO_2$ was prepared. As the sixth sub-component, $CaCO_3$ was prepared.

The barium titanate powder and the first to sixth sub-components were weighed so that the ratio of the barium titanate powder and the first to sixth sub-components was a predetermined value. The resulting power was sufficiently wet-blended and crushed by a ball mil, and the dielectric materials was obtained. Next, as an organic binder, butyral was added to the resulting dielectric material. As a solvent, toluene or ethanol was added to the resulting dielectric material. A zirconia bead was used as a dispersing media. And, slurry was obtained. A usage amount of the zirconia bead was adjusted so that an amount of Zr was 0.20 atm % or more and 0.26 atm % or less when an amount of Ti of $Ba_mTiO_3$ was 100 atm %.

(Example 1) In an example 1, $MnCO_3$ was added so that an amount of Mn acting as the first sub-component was 0.05 atm %, MgO was added so that an amount of Mg acting as the second sub-component was 0.60 atm %, $Ho_2O_3$ was added so that an amount of Ho acting as the third sub-component was 0.68 atm %, $V_2O_5$ was added so that an amount of V acting as the fourth sub-component was 0.25 atm %, $SiO_2$ was added so that an amount of Si acting as the fifth sub-component was 0.50 atm %, and $CaCO_3$ was added so that an amount of Ca acting as the sixth sub-component was 0.15 atm %, on a presumption that an amount Ti of $Ba_mTiO_3$ powder was 100 atm %. And, "m" was 0.9997.

(Example 2) In an example 2, $MnCO_3$ was added so that the amount of Mn acting as the first sub-component was 0.15 atm %. Other conditions were the same as those of the example 1.

(Example 3) In an example 3, $MnCO_3$ was added so that the amount of Mn acting as the first sub-component was 0.35 atm %. Other conditions were the same as those of the example 1.

(Comparative example 1) In a comparative example 1, the first sub-component was not added. "m" was 0.9996. Other conditions were the same as those of the example 1.

(Comparative example 2) In a comparative example 2, MnCO$_3$ was added so that the amount of Mn acting as the first sub-component was 0.45 atm %. "m" was 0.9996. Other conditions were the same as those of the example 1.

(Example 4) In an example 4, MnCO$_3$ was added so that an amount of Mn acting as the first sub-component was 0.15 atm %, MgO was added so that an amount of Mg acting as the second sub-component was 0.40 atm %, Ho$_2$O$_3$ was added so that an amount of Ho acting as the third sub-component was 0.68 atm %, V$_2$O$_5$ was added so that an amount of V acting as the fourth sub-component was 0.25 atm %, SiO$_2$ was added so that an amount of Si acting as the fifth sub-component was 0.50 atm %, CaCO$_3$ was added so that an amount of Ca acting as the sixth sub-component was 0.15 atm %, on a presumption that an amount Ti of Ba$_m$TiO$_3$ powder was 100 atm %. And, "m" was 0.9996.

(Example 5) In an example 5, MgO was added so that the amount of Mg acting as the second sub-component was 0.60 atm %. "m" was 0.9997. Other conditions were the same as those of the example 4.

(Example 6) In an example 6, MgO was added so that the amount of Mg acting as the second sub-component was 0.80 atm %. "m" was 0.9993. Other conditions were the same as those of the example 4.

(Comparative example 3) In a comparative example 3, MgO was added so that the amount of Mg acting as the second sub-component was 0.20 atm %. "m" was 0.9995. Other conditions were the same as those of the example 4.

(Comparative example 4) In a comparative example 4, MgO was added so that the amount of Mg acting as the second sub-component was 1.0 atm %. "m" was 0.9998. Other conditions were the same as those of the example 4.

(Example 7) In an example 7, MnCO$_3$ was added so that an amount of Mn acting as the first sub-component was 0.15 atm %, MgO was added so that an amount of Mg acting as the second sub-component was 0.60 atm %, Ho$_2$O$_3$ was added so that an amount of Ho acting as the third sub-component was 0.50 atm %, V$_2$O$_5$ was added so that an amount of V acting as the fourth sub-component was 0.25 atm %, SiO$_2$ was added so that an amount of Si acting as the fifth sub-component was 0.50 atm %, CaCO$_3$ was added so that an amount of Ca acting as the sixth sub-component was 0.15 atm %, on a presumption that an amount Ti of Ba$_m$TiO$_3$ powder was 100 atm %. And, "m" was 0.9999.

(Example 8) In an example 8, Ho$_2$O$_3$ was added so that the amount of Ho acting as the third sub-component was 0.70 atm %. "m" was 0.9997. Other conditions were the same as those of the example 7.

(Example 9) In an example 9, Ho$_2$O$_3$ was added so that the amount of Ho acting as the third sub-component was 0.90 atm %. "m" was 0.9998. Other conditions were the same as those of the example 7.

(Comparative example 5) In a comparative example 5, Ho$_2$O$_3$ was added so that the amount of Ho acting as the third sub-component was 0.20 atm %. "m" was 0.9996. Other conditions were the same as those of the example 7.

(Comparative example 6) In a comparative example 6, Ho$_2$O$_3$ was added so that the amount of Ho acting as the third sub-component was 1.10 atm %. "m" was 0.9996. Other conditions were the same as those of the example 7.

(Example 10) In an example 10, MnCO$_3$ was added so that an amount of Mn acting as the first sub-component was 0.15 atm %, MgO was added so that an amount of Mg acting as the second sub-component was 0.60 atm %, Ho$_2$O$_3$ was added so that an amount of Ho acting as the third sub-component was 0.68 atm %, V$_2$O$_5$ was added so that an amount of V acting as the fourth sub-component was 0.15 atm %, SiO$_2$ was added so that an amount of Si acting as the fifth sub-component was 0.60 atm %, CaCO$_3$ was added so that an amount of Ca acting as the sixth sub-component was 0.15 atm %, on a presumption that an amount Ti of Ba$_m$TiO$_3$ powder was 100 atm %. And, "m" was 1.0001.

(Example 11) In an example 11, V$_2$O$_5$ was added so that the amount of V acting as the fourth sub-component was 0.25 atm %. "m" was 1.0002. Other conditions were the same as those of the example 10.

(Example 12) In an example 12, V$_2$O$_5$ was added so that the amount of V acting as the fourth sub-component was 0.30 atm %. "m" was 1.0002. Other conditions were the same as those of the example 10.

(Comparative example 7) In a comparative example 7, the fourth sub-component was not added. "m" was 1.0002. Other conditions were the same as those of the example 10.

(Comparative example 8) In a comparative example 8, V$_2$O$_5$ was added so that the amount of V acting as the fourth sub-component was 0.35 atm %. "m" was 0.9998. Other conditions were the same as those of the example 10.

(Example 13) In an example 13, MnCO$_3$ was added so that an amount of Mn acting as the first sub-component was 0.15 atm %, MgO was added so that an amount of Mg acting as the second sub-component was 0.60 atm %, Ho$_2$O$_3$ was added so that an amount of Ho acting as the third sub-component was 0.68 atm %, V$_2$O$_5$ was added so that an amount of V acting as the fourth sub-component was 0.25 atm %, SiO$_2$ was added so that an amount of Si acting as the fifth sub-component was 0.40 atm %, CaCO$_3$ was added so that an amount of Ca acting as the sixth sub-component was 0.15 atm %, on a presumption that an amount Ti of Ba$_m$TiO$_3$ powder was 100 atm %. And, "m" was 0.9998.

(Example 14) In an example 14, SiO$_2$ was added so that the amount of Si acting as the fifth sub-component was 0.60 atm %. "m" was 0.9995. Other conditions were the same as those of the example 13.

(Example 15) In an example 15, SiO$_2$ was added so that the amount of Si acting as the fifth sub-component was 0.90 atm %. "m" was 1.0000. Other conditions were the same as those of the example 13.

(Comparative example 9) In a comparative example 9, SiO$_2$ was added so that the amount of Si acting as the fifth sub-component was 0.30 atm %. "m" was 1.0000. Other conditions were the same as those of the example 13.

(Comparative example 10) In a comparative example 10, SiO$_2$ was added so that the amount of Si acting as the fifth sub-component was 1.00 atm %. "m" was 0.9996. Other conditions were the same as those of the example 13.

(Example 16) In an example 16, MnCO$_3$ was added so that an amount of Mn acting as the first sub-component was 0.15 atm %, MgO was added so that an amount of Mg acting as the second sub-component was 0.60 atm %, Ho$_2$O$_3$ was added so that an amount of Ho acting as the third sub-component was 0.68 atm %, V$_2$O$_5$ was added so that an amount of V acting as the fourth sub-component was 0.25 atm %, SiO$_2$ was added so that an amount of Si acting as the fifth sub-component was 0.50 atm %, on a presumption that an amount Ti of Ba$_m$TiO$_3$ powder was 100 atm %. The sixth sub-component was nod added. And, "m" was 1.0002.

(Example 17) In an example 17, CaO was added so that the amount of Ca acting as the sixth sub-component was 0.25 atm %. Other conditions were the same as those of the example 16.

(Example 18) In an example 18, CaO was added so that the amount of Ca acting as the sixth sub-component was 0.45 atm %. Other conditions were the same as those of the example 16.

(Comparative example 11) In a comparative example 11, CaO was added so that the amount of Ca acting as the sixth sub-component was 0.55 atm %. Other conditions were the same as those of the example 16.

(Example 19) In an example 19, $MnCO_3$ was added so that an amount of Mn acting as the first sub-component was 0.15 atm %, MgO was added so that an amount of Mg acting as the second sub-component was 0.60 atm %, $Ho_2O_3$ was added so that an amount of Ho acting as the third sub-component was 0.68 atm %, $V_2O_5$ was added so that an amount of V acting as the fourth sub-component was 0.25 atm %, $SiO_2$ was added so that an amount of Si acting as the fifth sub-component was 0.50 atm %, $CaCO_3$ was added so that an amount of Ca acting as the sixth sub-component was 0.15 atm %, on a presumption that an amount Ti of $Ba_mTiO_3$ powder was 100 atm %. And, "m" was 0.9990.

(Example 20) In an example 20, "m" was 1.0002. Other conditions were the same as those of the example 19.

(Example 21) In an example 21, "m" was 1.0015. Other conditions were the same as those of the example 19.

(Comparative example 12) In a comparative example 12, "m" was 0.9985. Other conditions were the same as those of the example 19.

(Comparative example 13) In a comparative example 13, "m" was 1.0020. Other conditions were the same as those of the example 19.

(Example 22) In an example 22, $MnCO_3$ was added so that an amount of Mn acting as the first sub-component was 0.15 atm %, MgO was added so that an amount of Mg acting as the second sub-component was 0.60 atm %, $Dy_2O_3$ was added so that an amount of Dy acting as the third sub-component was 0.68 atm %, $V_2O_5$ was added so that an amount of V acting as the fourth sub-component was 0.25 atm %, $SiO_2$ was added so that an amount of Si acting as the fifth sub-component was 0.50 atm %, $CaCO_3$ was added so that an amount of Ca acting as the sixth sub-component was 0.15 atm %, on a presumption that an amount Ti of $Ba_mTiO_3$ powder was 100 atm %. And, "m" was 0.9997.

(Comparative example 14) In a comparative example 14, $MnCO_3$ was added so that an amount of Mn acting as the first sub-component was 0.12 atm %, MgO was added so that an amount of Mg acting as the second sub-component was 0.80 atm %, $Ho_2O_3$ was added so that an amount of Ho acting as the third sub-component was 1.30 atm %, $V_2O_5$ was added so that an amount of V acting as the fourth sub-component was 0.18 atm %, $SiO_2$ was added so that an amount of Si acting as the fifth sub-component was 0.90 atm %, $CaCO_3$ was added so that an amount of Ca acting as the sixth sub-component was 0.20 atm %, on a presumption that an amount Ti of $Ba_mTiO_3$ powder was 100 atm %. And, "m" was 1.0002.

Figure 4:
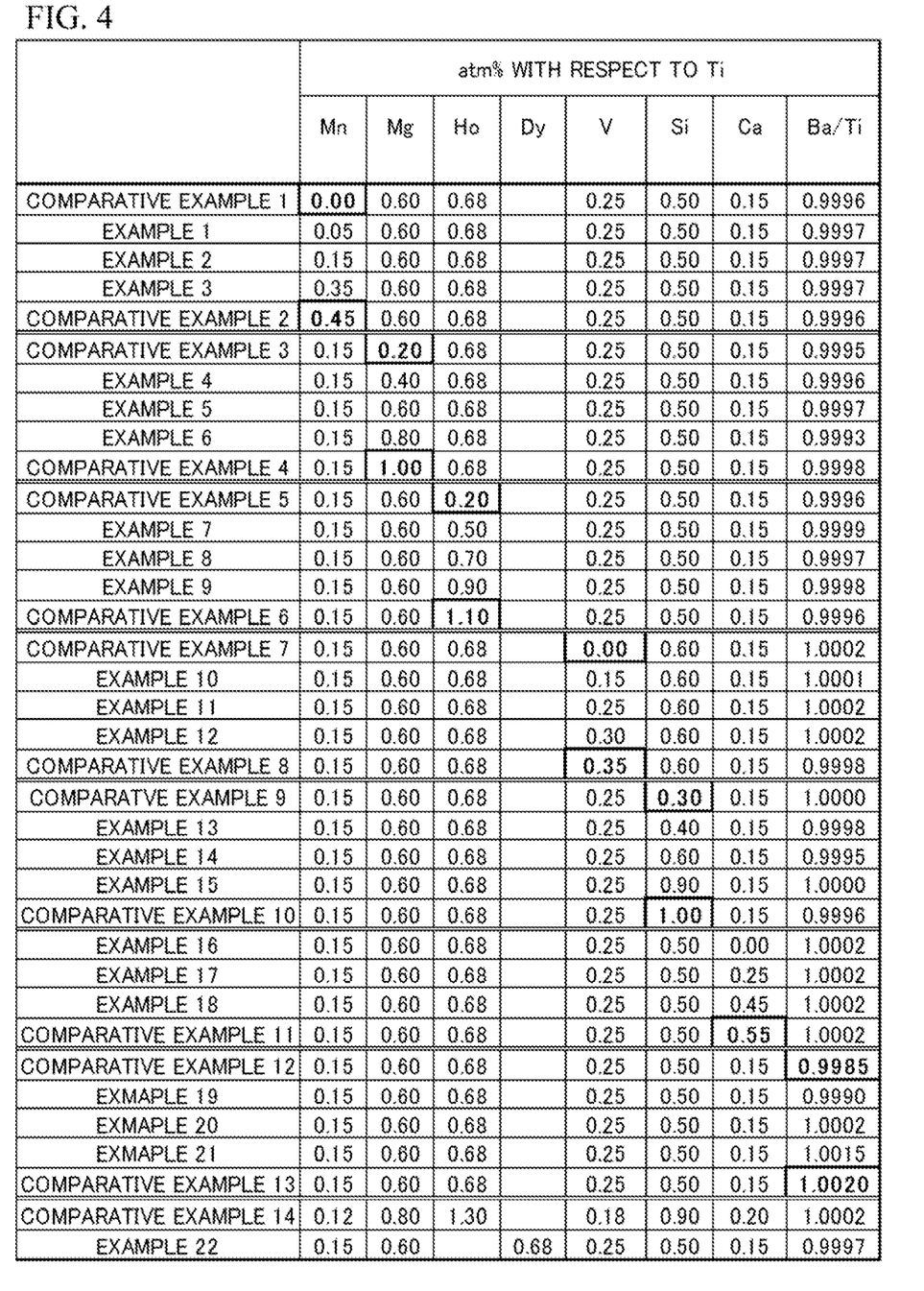
FIG. 4 illustrates added amounts of first to sixth sub-components of examples and comparative examples.

FIG. 4 illustrates the added amounts of the first to sixth sub-components and the values of "m". An empty of FIG. 4 indicates that the component was not intentionally added.

A dielectric green sheet having a thickness of 7 μm was formed from the slurry of the examples 1 to 22 and the comparative examples 1 to 14 by a doctor blade method. A paste for forming an internal electrode of which a main component was Ni was printed on the resulting green sheet. Thus, a pattern-formed sheet was formed. 10 numbers of the pattern-formed sheets were stacked on a cover sheet (50× green sheet). And, another cover sheet (50× green sheet) was stacked on the multilayer structure. After that, the resulting multilayer structure was pressed at 100 degrees C. to 120 degrees C.

And the resulting multilayer structure was cut into a predetermined shape. After binder removal process in a $N_2$ atmosphere, the resulting multilayer structure was fired for 2 hours at a temperature of 1230 degrees C. in a reductive atmosphere. In a temperature cooling process after the firing, an oxygen partial pressure was increased and a re-oxidation process was performed. Thus, the ceramic main body 10 was obtained. After that, a Cu external paste including glass frit was coated on the two edge faces of the ceramic main body 10. The Cu external paste was fired in a $N_2$ atmosphere. And, the multilayer ceramic capacitor 100 of which a size was 3.2 mm×1.6 mm×0.6 mm was obtained. The thickness of the dielectric layers 11 was 5 μm.

An average grain diameter of the ceramic grains in the dielectric layers 11 after the firing was 330 nm in the example 1, 327 nm in the example 2, 335 nm in the example 3, 345 nm in the example 4, 327 nm in the example 5, 337 nm in the example 6, 331 nm in the example 7, 320 nm in the example 8, 323 nm in the example 9, 313 nm in the example 10, 311 nm in the example 11, 315 nm in the example 12, 308 nm in the example 13, 343 nm in the example 14, 330 nm in the example 15, 320 nm in the example 16, 306 nm in the example 17, 314 nm in the example 18, 340 nm in the example 19, 311 nm in the example 20, 307 nm in the example 21 and 330 nm in the example 22. The average grain diameter of the ceramic grains in the dielectric layer 11 after the firing was 329 nm in the comparative example 1, 331 nm in the comparative example 2, 1000 nm or more in the comparative example 3, 335 nm in the comparative example 4, 343 nm in the comparative example 5, 317 nm in the comparative example 6, 307 nm in the comparative example 7, 319 nm in the comparative example 8, 403 nm in the comparative example 10, 310 nm in the comparative example 11, 385 nm in the comparative example 12, 302 nm in the comparative example 13, and 198 nm in the comparative example 14.

(Analysis) Each measurement test was performed with respect to the multilayer ceramic capacitors 100 of the examples 1 to 22 and the comparative examples 1 to 14.

(Test of relative dielectric constant $\varepsilon_r$ and Tan δ) The multilayer ceramic capacitors 100 were subjected to 150 degrees C. four 1 hour. After leaving 24 hours at room temperature, a capacity and Tan δ of the multilayer ceramic capacitors 100 were measured by an LCR meter. The measurement condition was 1 kHz-1 Vrms. The relative dielectric constant $\varepsilon_r$ of the dielectric layers 11 was calculated from the capacity C in accordance with the following formula (1) with use of an active area S, a number of layers n, a thickness t of the dielectric layer 11 and a vacuum dielectric constant $\varepsilon_0$. The active area is a total area of facing areas of all pairs of the internal electrode layers 12 next to each other in a capacity region in which the internal electrode layers 12 that are connected to the different external electrode and are next to each other face with each other.

$$\varepsilon_r = (C \times t)/(\varepsilon_0 \times S \times n) \qquad (1)$$

(Temperature characteristic test) Next, a MAX temperature at which the capacity C was maximum was measured. A ratio of the capacity C at the MAX temperature and the capacity C at 125 degrees C. (MAX/125 degrees C.) was measured. When the MAX temperature was within 35 degrees C. to 125 degrees C. and the ratio (MAX/125 degrees C.) was 0.8 to 1, X7R was determined as OK. When at least one of the MAX temperature and the capacity C was out of the ranges, X7R was determined as NG.

(Lifetime test) MTTF (Mean Time to Failure) was measured by measuring a time until a resistance value was smaller than an insulation resistance before the test by 3 digit when a voltage (electric field) of 30 V/μm was applied at 150 degrees C.

Figure 5:
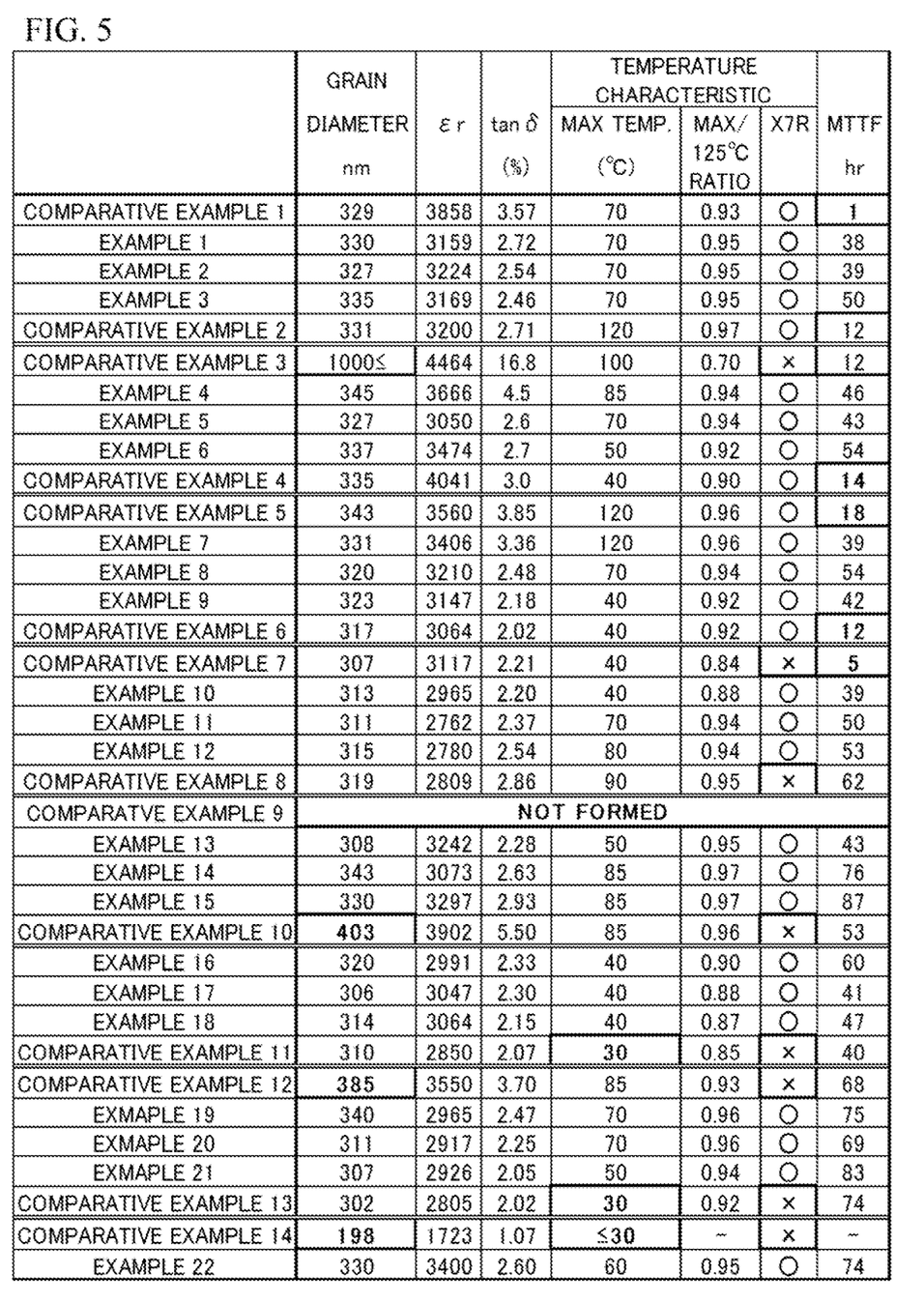
FIG. 5 illustrates measured result of examples and comparative examples.

FIG. 5 illustrates each measurement result of the examples 1 to 22 and the comparative examples 1 to 14. In the comparative example 1, the MTTF was a short value which was 1 hour. And, sufficient reliability was not achieved. It is thought that this was because the first sub-component was not added. Next, in the comparative example 2, the MTTF was a short time which was 12 hours. And, sufficient reliability was not achieved. It is thought that this was because the added amount of the first sub-component was more than 0.35 atm %.

In the comparative example 3, grain growth occurred, and reliability was degraded. And, sufficient capacity stability was not achieved. It is thought that this was because the added amount of the second sub-component was less than 0.40 atm %. In the comparative example 4, the MTTF was a short value which was 14 hours. And sufficient reliability was not achieved. It is thought that this was because the added amount of the second sub-component was more than 0.8 atm %.

In the comparative example 5, the MTTF was a short value which was 18 hours. And sufficient reliability was not achieved. It is thought that this was because the added amount of the third sub-component was less than 0.5 atm %. In the comparative example 6, sintering characteristic was degraded. And sufficient reliability was not achieved. It is thought that this was because the added amount of the third sub-component was more than 0.9 atm %.

In the comparative example 7, the MTTF was a short value which was 5 hours. And sufficient reliability was not achieved. And sufficient capacity stability was not achieved. It is thought that this was because the fourth sub-component was not added. In the comparative example 8, sufficient capacity stability was not achieved. It is thought that this was because the added amount of the fourth sub-component was more than 0.30 atm %.

In the comparative example 9, it was not possible to densify and form the dielectric layer 11. It is thought that this was because the added amount of the fifth sub-component was less than 0.4 atm %. In the comparative example 10, the grain growth occurred. And sufficient capacity stability was not achieved. It is thought that this was because the added amount of the fifth sub-component was more than 0.9 atm %.

In the comparative example 11, sufficient capacity stability was not achieved. It is thought that this was because the added amount of the sixth sub-component was more than 0.45 atm %.

In the comparative example 12, the grain growth occurred. And sufficient capacity stability was not achieved. It is thought that this was because "m" of $Ba_mTiO_3$ was less than 0.9990. In the comparative example 13, sufficient capacity stability was not achieved. It is thought that this was because "m" was more than 1.0015.

In the comparative example 14, sufficient capacity stability was not achieved. It is thought that this was because a grain diameter in the dielectric layer 11 was less than 280 nm.

On the other hand, in the examples 1 to 22, the MTTF was a large value, and X7R was determined as OK. That is, it was possible to achieve both the high reliability and the capacity stability. It is thought that this was because Mn was added as the first sub-component by 0.05 atm % or more and 0.35 atm % or less, Mg was added as the second sub-component by 0.4 atm % or more and 0.8 atm % or less, the rare earth element Re which was at least one of Ho and Dy was added as the third sub-component by 0.5 atm % or more and 0.9 atm % or less, V was added as the fourth sub-component by 0.15 atm % or more and 0.30 atm % or less, Si was added as the fifth sub-component by 0.4 atm % or more and 0.9 atm % or less, and Ca was added as the sixth sub-component by 0.00 atm % or more and 0.45 atm % or less, to the ceramic powder having a perovskite structure expressed by $Ba_mTiO_3$ ($0.9990 \leq m \leq 1.0015$), on a presumption that an amount of Ti of $Ba_mTiO_3$ was 100 atm %, and the average grain diameter of $Ba_mTiO_3$ was 280 nm or more and 380 nm or less in the dielectric layers 11 after the firing process.

Although the embodiments of the present invention have been described in detail, it is to be understood that the various change, substitutions, and alterations could be made hereto without departing from the spirit and scope of the invention.

What is claimed is:

1. A ceramic capacitor comprising:
a multilayer structure in which each of a plurality of dielectric layers and each of a plurality of internal electrode layers are alternately stacked,
wherein a main component of the plurality of dielectric layers is $BaTiO_3$,
wherein the plurality of dielectric layers include 0.05 atm % or more and 0.35 atm % or less of Mn as a first sub-component, 0.4 atm % or more and 0.8 atm % or less of Mg as a second sub-component, 0.5 atm % or more and 0.9 atm % or less of a rare earth element which is at least one of Ho and Dy as a third sub-component, 0.15 atm % or more and 0.30 atm % or less of V as a fourth sub-component, 0.4 atm % or more and 0.9 atm % or less of Si as a fifth sub-component, 0.00 atm % or more and 0.45 atm % or less of Ca as a sixth sub-component, on a presumption that an amount of Ti of the main component is 100 atm %,
wherein an average grain diameter of ceramic grains of the plurality of dielectric layers is 280 nm or more and 380 nm or less.

2. The ceramic capacitor as claimed in claim 1, wherein the ceramic capacitor has a length of 0.25 mm, a width of 0.125 mm and a height of 0.125 mm.

3. The ceramic capacitor as claimed in claim 1, wherein the ceramic capacitor has a length of 0.4 mm, a width of 0.2 mm and a height of 0.2 mm.

4. The ceramic capacitor as claimed in claim 1, wherein the ceramic capacitor has a length of 3.2 mm, a width of 1.6 mm and a height of 1.6 mm.

5. The ceramic capacitor as claimed in claim 1, wherein the plurality of dielectric layers include 0.10 atm % or more and 0.30 atm % or less of Mn as the first sub-component.

6. The ceramic capacitor as claimed in claim 1, wherein the plurality of dielectric layers include 0.5 atm % or more and 0.7 atm % or less of Mg as the second sub-component.

7. The ceramic capacitor as claimed in claim 1, wherein the plurality of dielectric layers include 0.6 atm % or more and 0.8 atm % or less of the rare earth element as the third sub-component.

8. The ceramic capacitor as claimed in claim 1, wherein the plurality of dielectric layers include 0.18 atm % or more and 0.27 atm % or less of V as the fourth sub-component.

9. The ceramic capacitor as claimed in claim 1, wherein the plurality of dielectric layers include 0.5 atm % or more and 0.8 atm % or less of Si as the fifth sub-component.

10. The ceramic capacitor as claimed in claim 1, wherein the plurality of dielectric layers include 0.1 atm % or more and 0.4 atm % or less of Ca as the sixth sub-component.

11. The ceramic capacitor as claimed in claim 1, wherein the BaTiO$_3$ is Ba$_m$TiO$_3$ (0.9990≤m≤1.0015).

12. The ceramic capacitor as claimed in claim 1, wherein an average grain diameter of BaTiO$_3$ is 300 nm or more and 360 nm or less.

13. The ceramic capacitor as claimed in claim 1, further comprising:
   a cover layer including the main component of the dielectric layers and the first to the sixth sub-components, in a stacking direction of the multilayer structure.

14. The ceramic capacitor as claimed in claim 1, wherein the ceramic capacitor satisfies X7R characteristic of EIA standard.

* * * * *